United States Patent [19]
Dansky et al.

[11] Patent Number: 6,028,989
[45] Date of Patent: Feb. 22, 2000

[54] CALCULATING CROSSTALK VOLTAGE FROM IC CRAFTSMAN ROUTING DATA

[75] Inventors: Allan Harvey Dansky, Poughkeepsie; Howard Harold Smith, Beacon; Fadi Yusuf Busaba, Poughkeepsie; Michael Alexander Bowen, Poughkeepsie; Adrian Zuckerman, Poughkeepsie, all of N.Y.

[73] Assignee: International Business Machines Corporation, Armonk, N.Y.

[21] Appl. No.: 09/059,220

[22] Filed: Apr. 13, 1998

[51] Int. Cl.[7] .................................................. G06F 9/455
[52] U.S. Cl. .............................. 395/500.09; 395/500.05; 395/500.06; 395/500.36
[58] Field of Search ..................................... 364/489, 578; 395/500, 500.05, 500.06, 500.09, 500.36, 500.13, 500.14, 500.15

[56] References Cited

U.S. PATENT DOCUMENTS

| | | | |
|---|---|---|---|
| 5,481,695 | 1/1996 | Purks | 395/500.36 |
| 5,535,133 | 7/1996 | Petschauer et al. | 364/489 |
| 5,555,506 | 9/1996 | Petschauer et al. | 395/500.06 |
| 5,568,395 | 10/1996 | Huang | 395/500.05 |

OTHER PUBLICATIONS

"Cadence's SPECCTRAQuest Interconnect Designer Extends PCB Design Planning From Concept Through Implementation," press release found at: http://www.cadence.com/press_box/releases/SPECCTRAQuest.html, Sep. 1997.

Primary Examiner—Kevin J. Teska
Assistant Examiner—Samuel Broda
Attorney, Agent, or Firm—Lynn L. Augspurger

[57] ABSTRACT

A program method for noise calculation and modeling caculates crosstalk voltage for a planned chip design, by first running routing and crosstalk routines for creating crosstalk rules for the planned design of a chip and loading crosstalk rules after routing is completed, and calculating the noise voltage of the planned design based on the exact topologies/paths of the victim and perpetrator nets of the planned design by path tracing and outputting a program file which contains the calculated noise voltage and a complete tabulation of the key physical and electrical parameters of the victim and perpetrator nets of the planned design, and then modeling using a network analysis program to selected nets of the design which exceed allowed noise limitations and obtaining the planned design net's network topology as an output while using the program file containing noise voltage calculation results as an input to the net's topology circuit simulation modeling program and outputting a nodal voltages vs. time data at each receiver location on a victim net as well as key nodes on any perpetrator nets of said planned design.

12 Claims, 3 Drawing Sheets

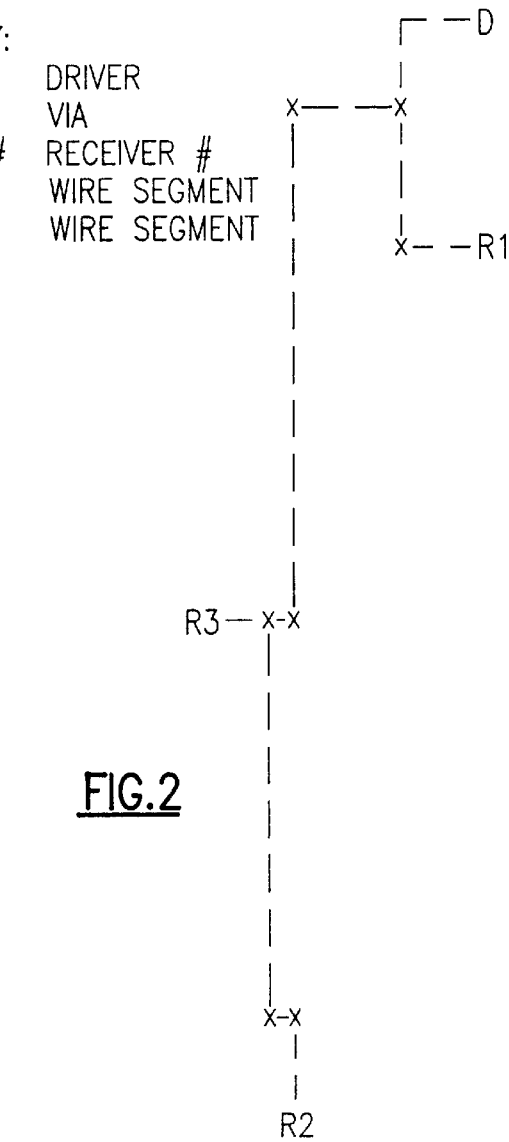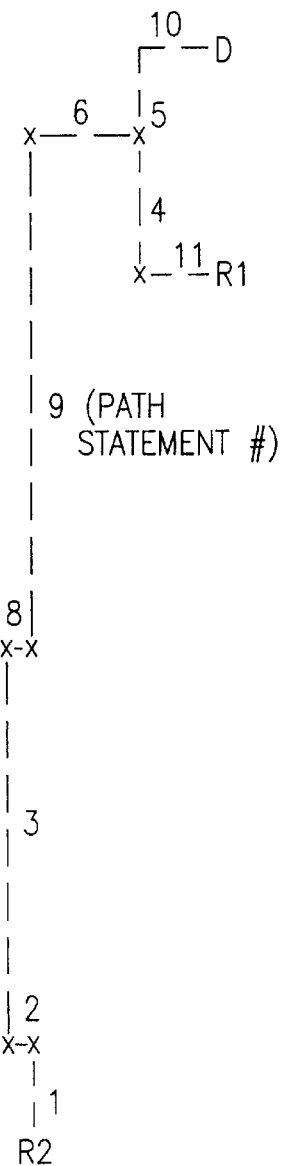
FIG.2
FIG.3C

"|MCODE_LOAD_R_RP(19)"
NOTE: PATH STATEMENT # FOLLOWS THE "i=" FIELD i=1  (WIRE (PATH M2 90 1178190 195085 1178190 192875) DIR= yHL
i=2  (WIRE (PATH M3 90 1174770 195085 1178190 195085) DIR= xLH
i=3  (WIRE (PATH M4 90 1174770 387715 1174770 195085) DIR= yHL
i=4  (WIRE (PATH M2 90 1211130 712060 1211130 601560) DIR= yHL
i=5  (WIRE (PATH M2 90 1211130 712060 1211130 745195) DIR= yHL
i=6  (WIRE (PATH M3 90 1178505 712360 1211130 712060) DIR= yLH
i=7  (WIRE (PATH M3 90 1174770 387715 1168830 387715) DIR= xHL
i=8  (WIRE (PATH M3 90 1174770 387715 1178280 387715) DIR= xHL
i=9  (WIRE (PATH M4 90 1178280 531805 1178505 712360) DIR= xHL
i=10 (WIRE (PATH M3 90 1211130 745195 1227330 745195 1227330 745790) DIR= xHL
i=11 (WIRE (PATH M1 90 1211130 601560 1234080 601560) DIR= xHL

CALCULATING CROSSTALK VOLTAGE FROM IC CRAFTSMAN ROUTING DATA

FIELD OF THE INVENTION

This invention is related to signal coupling between wires used on VLSI Integrated Circuit Chips. These wires exist on the metal levels above the silicon and are used to connect the devices. There are millions of wires on these chips which are used in computers.

GLOSSARY

The following definitions may be helpful.
VLSI stands for Very Large Scale Integration
CCT is a group within Cadence Design which has a program used for Integrated Chip placement, wire routing, and noise voltage analysis.
ASX is an IBM program for circuit simulation similar to SPICE Here it is used to predict the noise voltage between coupled wires modelled as transmission lines with RLC elements in sections.
AWK is a programming language which is part of the UNIX operating system.
perp. coup. sect stands for perpetrator coupling section. This is the wire segment on the perp. net where the coupling to the victim net occurs.

BACKGROUND OF THE INVENTION

The chip design methodology for crosstalk (voltage induced on a victim wire caused by one or more adjacent switching wire(s) called the perpetrator(s)) noise analysis is designd for preventing hardware functional failures. Crosstalk creates unwanted noise pulses on quiet nets which when large enough cause the receiver on the quiet net to amplify the noise and propagate the error signal to a latch which can capture and store it. The crosstalk noise analysis is performed during chip wire routing and any design changes needed are made to those nets which exceed the allowed noise voltage limits. It is very important to prevent hardware failures since noise problems are due to complicated switching interactions and thus are very difficult to detect, diagnose and repair. Currently it is usually the chip design practice to use full net extraction programs such as Cadence Design's Dracula which take 24 hours or more for complicated chips, require a net list or schematic, and only give coupling capacitance (not the noise voltage).

However, even with such time consuming analysis experience with a high performance chip shows that undesirable signal coupling or crosstalk between adjacent long wires can create large enough noise voltages to cause system errors. In our previous generation chips, these noise voltages, created during scanning of test patterns, caused some of the latches in the test to store the wrong value.

SUMMARY OF THE INVENTION

Our preferred embodiment presented herein includes inductive contributions to noise voltage calculations and full modelling of both nets to include transition time degradation for the coupling net. Including both these effects makes the noise voltage calculation more accurate so the correct nets are identified and repaired.

We have provided a program method for noise calculation and modeling which caculates crosstalk voltage for a planned chip design. We first run routing and crosstalk routines for creating crosstalk rules in a router program used for wire routing for the planned design of a chip and load crosstalk rules after routing is completed. We also calculate the noise voltage of the planned design based on the exact topologies/paths of the victim and perpetrator nets of the planned design by path tracing and output a program file which contains the calculated noise voltage and a complete tabulation of the key physical and electrical parameters of the victim and perpetrator nets of the planned design. Then we model using the net's topology circuit simulation and using a network analysis program to selected nets of the design which exceed allowed noise limitations and obtain the planned design net's network topology as an output while using the program file containing noise voltage calculation results as an input to the net's topology circuit simulation modeling program and outputting a nodal voltages vs. time data at each receiver location on a victim net as well as key nodes on any perpetrator nets of said planned design.

The method we have provided allows avoidance, does not require a net schematic, runs in 1 to 2 hours, includes inductive effects, can output a human readable ASX network model, and outputs a full tabulation of all the electrical and physical values/parameters which serves as an aid in identifying and repairing nets which exceed the noise limits.

These improvements will be used for path tracing and noise voltage calculations in chip wire routing or extraction programs for design of future processors and other dense semiconductor products.

These and other improvements are set forth in the following detailed description. For a better understanding of the invention with advantages and features, refer to the description and to the drawings.

BRIEF DESCRIPTION OF THE DRAWINGS

FIG. 2 is a plot of a sample net as routed on four metal levels.

FIG. 3a illustrates path statements which are in random toplogical order and are numbered from 1 to 11. A path statement can have multiple wire segments.

FIG. 3b shows the output of the path tracing algorithm which are three string sequences in ORDER from the driver to each receiver.

FIG. 3c shows path statement numbers to illustrate the correspondence between plot and the sequence strings. (Note: For convenience of illustration, FIGURES may be separated in parts and as a convention we place the top of the FIGURE as the first sheet, with subsequent sheets proceeding down and across when viewing the FIGURE, in the event that multiple sheets are used.)

DETAILED DESCRIPTION OF THE INVENTION

Figure 1:
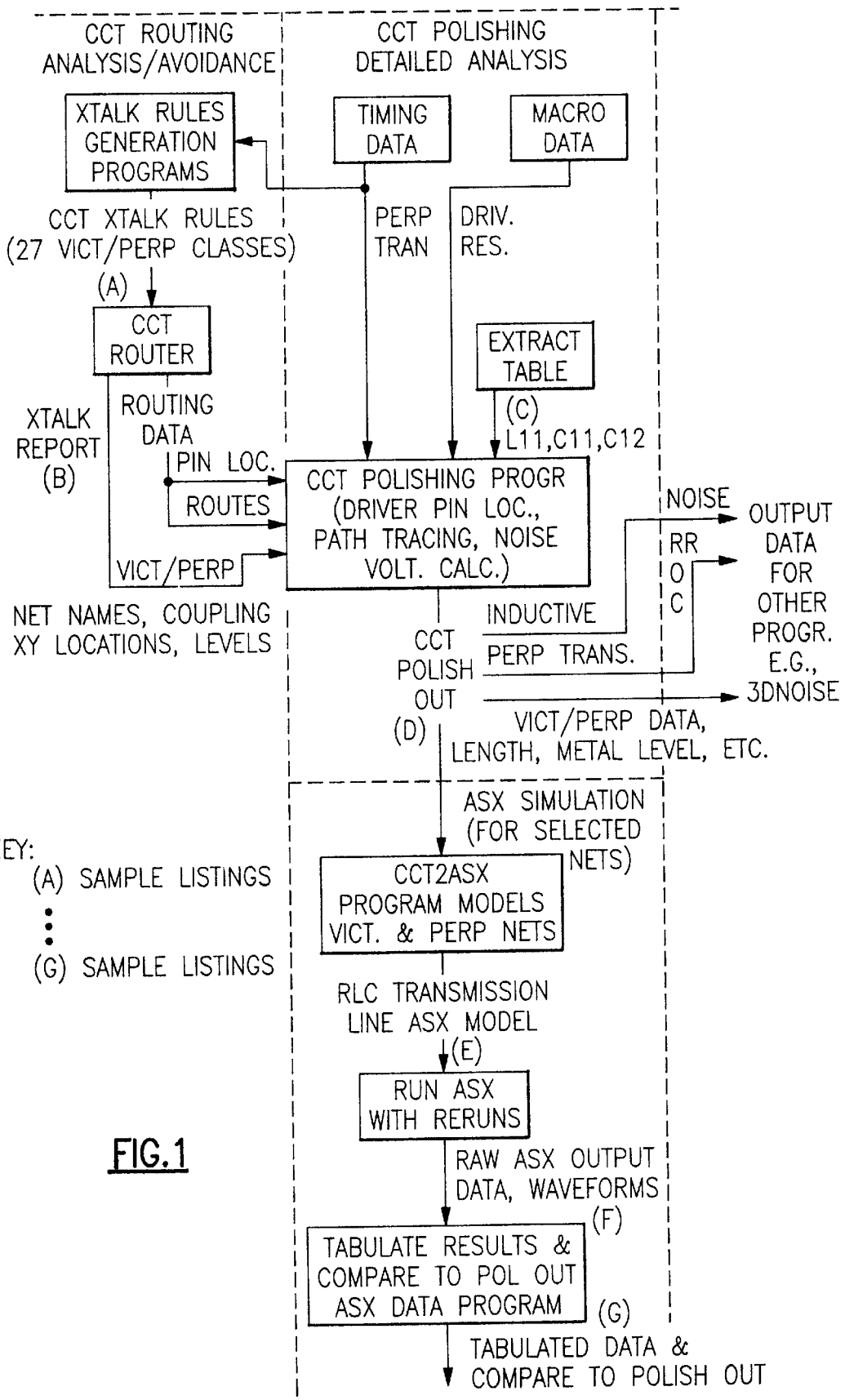
FIG. 1 shows an overview of the preferred embodiment in which three processes are separated by dashed lines, the three processes being a first procedure for CCT ROUTING ANALYSIS/AVOIDANCE, a second procedure for CCT POLISHING DETAILED ANALYSIS, and a third procedure for ASX SIMULATION (FOR SELECTED NETS).

Turning now to our invention in greater detail, in FIG. 1, three procedures are separated by dashed lines. These three main procedures or processes of our method are:
1. CCT Routing Analysis/Avoidance
2. "CCT Polish Program" or Detailed Noise Voltage Prediction
3. ASX Simulation of Selected Nets These new procedures offer a range of complexity with increasing noise voltage computation accuracy. These three procedures offer improvements over existing techniques for crosstalk analysis in a number of ways including:
1. fast speed and three tradeoffs between accuracy and complexity
2. full integration with routing tool for both crosstalk analysis and avoidance
3. topology/path tracing which provides more accurate noise calculation
4. a net list or schematic is not needed but is required by full extracion programs (such as Cadence Design's Dracula)
5. automatic generation of a network model for full circuit simulation using ASX
6. coupling includes mutual inductance and self inductance of victim an perpetrator nets
7. full physical and electrical parameter output tabulation such as xy location of coupled section , metal levels of wire segments, wire widths, coupling capacitance, mutual inductance, etc.

The methodology is best described through the use of the flow diagram shown in FIG. 1. The dotted lines separate the three procedures listed above. Each of the three procedures comprises one or two programs which are preferably written using the AWK programming language. FIG. 1 illustrates by a flow diagram our preferred process including a first process or procedure for CCT ROUTING ANALYSIS/ AVOIDANCE, a second process or procedure for CCT POLISHING DETAILED ANALYSIS, and a third process or procedure for ASX SIMULATION (FOR SELECTED NETS).

Briefly,(1) the first procedure comprises running (e.g. the CCT group's IC Craftsman ) routing and crosstalk tools using a program to create crosstalk rules. Loading the crosstalk rules into the program AFTER routing has been completed, will cause a Crosstalk Report to be generated. If the crosstalk rules are loaded BEFORE wire routing has been completed, the routing tool will attempt to obey the rules by AVOIDING crosstalk and a Crosstalk Report will be generated after routing has completed;

(2) The second procedure (using CCT's Polish Program for accuracy) calculates the noise voltage based on the exact topologies/paths of the victim and perpetrator nets. This is accomplished by a complex path tracing algorithm (built into the CCT Polish Program). The output of the CCT Polish Program is the polish.out file which contains the calculated noise voltage and a complete tabulation of the key physical and electrical parameters of the victim and perpetrator nets.

(3) The third procedure illustrated in FIG. 1 as ASX SIMULATION (FOR SELECTED NETS) allows identification of a full tabulation of all the electrical and physical values/parameters which serves as an aid in identifying and repairing nets which exceed the noise limits. Using procedure 3, the nets which exceed allowed noise limits can be more exactly modelled or simulated by using a network analysis tool such as ASX to model selected nets. The net's network topology is obtained as an output (e.g. Table F below) from the cct2asx program using the polish.out file as an input. The net's topology is an input to the ASX circuit simulation program. The ASX program will output the nodal voltages vs. time at each of the receiver locations on the victim net as well as key nodes on the perpetrator nets.

The cct2asx program is and can be written in two sections with the steps summarized as in the following Table 1 as follows:

TABLE 1

CCT2ASX

Section 1

- for each net (victim and perps)
- read net sequence strings from path tracing program
- determine consecutive asx node numbering based on net sequence strings
- start at driver and end at receivers creating a complete path (through all the wire segments for each net based on the sequence strings created by the path tracing program
- eliminate repeated segments due to branching
- build 2 dimensional arrays with consecutive node numbering pairs
  note: 2 dimensional index is [p(net name),(wire segment number)]

Section 2

- for each victim net
- print standard asx execution control statements
- Read polish.out file to obtain metal levels, coupled lengths, coupled segment numbers, coupling capacitance, etc., for each perp coupling to a given victim net
- split wire path segment into coupled and uncoupled wire sections depending on how (4 cases) coupled section overlaps wire path segment which is dependent on the signal direction as obtained from the path tracing program output (refer to Table 2)
  (note: wire simulation model is different for coupled wires vs uncoupled wires)
- print model calling statements referencing wire electrical parameters from polish.out file and using node numbering arrays created in Section 1
- print required output voltage nodes list
  for every receiver, print the output voltage due to each perp
  e.g., a net with 3 receivers and 7 perps, will have an asx model listing requesting 21 noise voltages

TABLE 2

| | | | | | | | Wire Segment overlap of coupled sections (4 cases) | | | | | | | | | | | |
|---|---|---|---|---|---|---|---|---|---|---|---|---|---|---|---|---|---|---|
| # | | | | case B | | | | case A | | | | case C | | | | case D | | |
| # | | | | | p | num4 | num2 | v | | num2 | v | | | | | | p | num4 |
| # | | | | | p | | | v | | | v | | | | | | p | |
| # | | H | num2 | v | p | | | v | p | num4 | c | v | p | num4 | num2 | v | p | |
| # | ^ | | c | v | p | | | v | p | | . | v | p | | | c | v | p |
| # | \| | | . | v | p | | | v | p | | . | v | p | | . | v | p | |
| # | caseB | \| | . | v | p | | | v | p | | . | v | p | | . | v | p | |

TABLE 2-continued

| Wire Segment overlap of coupled sections (4 cases) | | | | | | | | | | | | | | | | | | | |
|---|---|---|---|---|---|---|---|---|---|---|---|---|---|---|---|---|---|---|---|
| # | LH | | . | v | p | | | v | p | | c | v | p | num3 | | . | v | p | |
| # | | | c | v | p | num3 | | v | p | | | v | | | | c | v | p | |
| # | | | | v | | | | v | p | | | v | | | | num1 | v | p | |
| # | L | num1 | v | | | | num1 | v | p | num1 | v | | | | | | p | | |
| # | | | | | | | | p | | | | | | | | | p | num3 | |
| # | | | | | | | | p | num3 | | | | | | | | | | |
| # | | | 2 sect. | | | | 2 sect. | | | | 3 sect. | | | | | 1 sect. | | | | v = victim net wire p= perp net wire c ..c shows coupled sections, those section where the victim and perp net wires are coupled.

In more detail it will be understood that the first procedure (Procedure #1) uses the IC craftman routing and crosstalk tool supplied by the CCT group which is now part of Cadence Design. This procedure uses a very crude noise voltage calculation equation. The noise voltage equals a "weight"×(parallel length of the 2 adjacent wires). The "weight" depends on the spacing between the 2 wires and the key electrical and physical properties (but NOT the topology) of the victim and perpetrator nets. The program box (refer to FIG. 1) labeled Xtalk Rules Generation Programs generates the weight values and divides the perpetrator and victim nets into classes automatically after reading the timing database and net length (not shown in FIG. 1). The outputs of the program are the CCT crosstalk rules labelled as output (A). Note, in FIG. 1, there are sample program outputs labeled (A) through (G). A partial listing of inputs/outputs of the labeled items (A) through (G) are contained in the Tables below. This program is unique in that it creates weights which vary according to the 27 class combinations between victim and perpetrator nets, thereby improving upon the IC Craftsman crude noise voltage formula which is the product of (weight) times (parallel length). These Crosstalk rules are loaded into the router tool after routing and a Crosstalk Report (B) is then generated. At this point, two different actions can be taken:

1. Delete all the previously routed wires and route again with the Crosstalk rules loaded so now the router will try to obey the rules thereby reducing Crosstalk
2. Perform more accurate noise voltage calculation using the CCT Polishing Program which will use the Crosstalk Report (B) as one of its data file inputs. It reads 9 different file inputs.

The second procedure (Procedure #2) comprises causing the CCT Polish Program to read the Crosstalk Report (see Table B) plus 7 other files and producing the polish.out file which lists the total noise e voltage calculated for each victim net (refer to Table D for a sample listing). The partial (only the output physical and electrical data for perp #1 and perpetrator #10 are given) listing for one victim sample net in Table D ends with the line starting with the phrase "TOTAL NOISE for Vict. net". This line lists the separate contributions for inductive and capacitive noise voltages. The CCT Polish Program contains the following 9 major sections:

(A) Based on driver pin name, create arrays for inst. name and pin name for each vict. and perpetrator net;
(B) create arrays for component name for each (net,pin#)
(C) Determine the chip level locations for macro output pins for each net;
(D) path trace for each net, i.e. create a string of path segments for each receiver (complex code); (E1) Locate
(E1) Locate each coupling section in victim path sequence;
(E2) loop on all path segments to find match with perp. coup. sect;
(F) Calculate of extraction parameters;
(G) Call noise voltage functions; and
(H) Function definitions for 3 cases (damped, perfect, ripple).

Section D is a critical section and has been referred to above as a complex path tracing algorithm. FIG. 2 is a plot of a sample net as routed on four metal levels. The path tracing is necessary for both the victim and perpetrator nets. The sample net is a connection of 4 pins, (1 Driver and 3 Receivers), and its routing contains 11 wire segments called paths. The path tracing algorithm reads the 11 path statements (listed in FIG. 3a, and traces the three sequences of path statements from the Driver pin to each one of the three Receivers. The driver pin location is determined from data cross references in Sections A through C. The path statements in FIG. 3a are not in random toplogical order and are numbered from 1 to 11. A path statement can have multiple wire segments, as long as a via is not encountered. A wire segment is a pair of xy values, and path statement #9 for example has 4 wire segments. Each path statement ends with the "DIR" field which indicates either the x or y direction for the wire segment and either an LH or HL designation. The designation signifies Low to High or High to Low coordinate values for propagation of the signal along the path statements from the driver to the receivers. The signal directions on both the victim and perpetrator nets are important for calculating the noise voltage. The noise voltage is greater when the signal directions are opposite for the victim and perpetrator nets.

FIG. 3b shows the output of the path tracing algorithm which are 3 string sequences in ORDER from the driver to each receiver. The string sequences take into account multiple branches on the net. Some complicated nets with greater than 10 receivers and multiple branching can contain more than 45 path statements spread over more than 10 string sequences. The string sequences are absolutely necessary for accurate noise voltage calculation. The noise voltage is a strong function of the location of the coupled section with respect to the Driver pin and each Receiver pin. FIG. 3c shows the path tracing sequence from FIG. 3b superimposed on the plot of FIG. 2. FIG. 3c is just to understand the correspondence between the plot and the sequence strings. The CCT Polish Program does its noise calculations just using the string sequences of FIG. 3b to determine electrical parameters such as the resistance from the driver pin to the coupling section for the victim net and such as the total capacitance "downstream" (including branches) from the coupling section of the perpetrator net. This "downstream" capacitance is used to calculate the transition time degradation along the perpetrator net from its Driver to the coupling section. Sections E1and E2 of the CCT Polish Program link the string sequences from the path tracing with the x,y data from the Crosstalk Report input file. This will locate the coupling section path statement # in the string sequences for both the victim and perpetrator nets. The remaining 3 Sections F, G, and H contain the extraction table lookup (F, see Table C for a partial listing) to obtain the C11, L11, C12, L12 values based on the metal levels and widths for the victim and perpetrator coupling sections, and the actual noise calculation equations (Sections G and H).

Closed form equations were developed to estimate the noise levels (in MV) on a net (victim net) due to transition on another net (perp net). Only one perp and one victim net are used. The closed form equations are based on a lumped elements model of coupled transmission lines. The parameters forhe the lumped model are the following.
1. Perp transition time (Tr ns).
2. Mutual capacitance between the two nets (C12 mF).
3. Self-capacitance of the victim net (Cg mF).
4. Self-inductance of the victim net (Lg mH).
5. Wire resistance of the victim net +output resistance of the victim driver.

Three sets of equations were developed depending on the value of the in poles in the lump model. If the poles are real negative, the equation of the noise will be a summation of exponential terms. If, the poles are imaginary, the equation consists of exponential times sinusoidal. Finally if there are double real negative poles, the equation consist of a ramp time exponential. The peak noise is calculated for the three cases. The value and location of the poles depend on the parameters of the circuit, namely on the victim resistance (parameter number 5) and on the transmission line characteristic impedance ($Z0=Sqrt(Lg/(Cg+C12))$). The poles are real negative when $R>2*Z0$, imaginary if $R<2*Z0$, and are equal (double pole) if $R=2*Z0$.

The sample partial listings of program inputs/outputs A to F (referenced by the letter in parenthesis in FIG. 1) are listed in the Tables below with the corresponding referenced letter. We have not included the data of the output. The data output of P#3 is outputted as tablulated data and not shown in a Table. Tables a line with a series of dots means the lines are repeats of similar data and have been eliminated for brevity.

TABLES A through F

TABLE A

CCT Crosstalk Rules

```
# class limits for victim nets (v) and perpetrator nets (p)
# v1 driv_res<.1
# v2 driv_res>=.1 && driv_res<.5
# v3 driv_res>=.5
# L1<2000 um; L2>=2000 && L2<4000; L3>=4000 "
# p1 avg_tr<.2
# p2 avg_tr>=.2 && avg_tr<.5
# p3 avg_tr>=.5
define (class p1
   "|a_clk_rp0(0)"    "|a_clk_rp0(1)"    ..........
   "|a_clk_rp1(3)"    "|a_clk_rp2(0)"    ..........
   ................................................
   "|mcode_load_r_rp(17)" "|mcode_load_r_rp(18)" "|mcode_load_r_rp(19)"
   ................................................
   define (class v1L3
   ................................................
   "|mcode_load_r_rp(19)" "|mcode_load_r_rp(20)" "|mcode_load_r_rp(21)"
   ................................................
# 9 Victim classes using combinations of driv. res. and length
#v1: driv_res<.1;   v2: .1<=driv_res<.5;   v3: driv_res>=.5
#L1<2000 um; L2>=2000 && L2<4000; L3>=4000

# 3 perpetrator classes      p1              p2              p3
#                            tran<.2         .2<=tran<.5     tran>=.5
   ................................................
# Weight Table Goes Here
rule class v3L3 (parallel_segment off) (tandem_segment off)
rule class v3L3 (max_noise 50)
rule class_class p1 v3L3 (parallel_noise off)
rule class_class p1 v3L3 (tandem_noise off)
rule class_class p1 v3L3 (directional) (tandem_noise (gap -3.6) (threshold 100) (weight 0.029))
rule class_class p1 v3L3 (directional) (tandem_noise (gap -1.8) (threshold 100) (weight 0.026))
rule class_class p1 v3L3 (directional) (tandem_noise (gap 0.1) (threshold 100) (weight 0.024))
rule class_class p1 v3L3 (directional) (parallel_noise (gap 0.9) (threshold 100) (weight 0.048))
rule class_class p3 v2L2 (parallel_noise off)
rule class_class p3 v2L2 (tandem_noise off)
rule class_class p3 v2L2 (directional) (tandem_noise (gap -3.6) (threshold 100) (weight 0.022))
rule class_class p3 v2L2 (directional) (tandem_noise (gap -1.8) (threshold 100) (weight 0.020))
rule class_class p3 v2L2 (directional) (tandem_noise (gap 0.1) (threshold 100) (weight 0.018))
rule class_class p3 v2L2 (directional) (parallel_noise (gap 0.9) (threshold 100) (weight 0.035))
report crosstalk window
```

TABLE B

Crosstalk Report

```
== Crosstalk Report ================================
IC Crosstalk Rules =================================
   -- No IC Crosstalk Rules Defined --
Layer Crosstalk Rules ==============================
```

-- No Net Crosstalk Rules Defined --
Class Crosstalk Rules ==============================
  Class v1L2
Maximum Noise=50
  Class v1L3
Maximum Noise=50
  Class v2L1
Maximum Noise=50
  Class v2L2
Maximum Noise=50
  Class v2L3
Maximum Noise=50
  Class v3L1
Maximum Noise=50
  Class v3L2
Maximum Noise=50
  Class v3L3
Maximum Noise=50
Class to Class Crosstalk Rules ==================
  Class p1 to Class v1L2
    Parallel Gap= 5.400 Length=100.000 Noise/Unit
Length= 0.006
    Parallel Gap= 2.700 Length=100.000 Noise/Unit
Length= 0.008
..........................................................
    NET "|mcode_load_r_rp(19)" Noise_Max=50
Actual_Noise=189 Parallel Rule_Gap= 0.900 Actual_Gap=
0.900 Overlap=1585.600 Noise=41
    Layer m4 11747.700 1950.850 to 11747.700 3877.150 Net
"|mcode_load_r_rp(19)"
    Layer m4 11745.900 2291.550 to 11745.900 4387.650 Net
"|dat|xlat_eax_q(2)"
..........................................................
Parallel Rule_Gap= 0.900 Actual_Gap= 0.900
Overlap=1440.900 Noise=37
    Layer m4 11782.800 3877.150 to 11782.800 5318.050 Net
"|mcode_load_r_rp(19)"
    Layer m4 11781.000 3617.950 to 11781.000 6389.700 Net
"|dat|xlat_base_mux(23)"

TABLE C

Extract Table inductance in uH/mm # capacitance in pF/mm # consistent units are: kOhms, mA, V, nS, pF, uH, mm #LEV_V LEV_P WID_V WID_P SPACE L11 L12 L22 C11 C12 C22

| LEV_V | LEV_P | WID_V | WID_P | SPACE | L11 | L12 | L22 | C11 | C12 | C22 |
|---|---|---|---|---|---|---|---|---|---|---|
| LM | LM | 1.8 | 1.8 | 1.8 | 0.000448 | 0.000192 | 0.000448 | 0.202 | 0.0560 | 0.202 |
| LM | LM | 1.8 | 1.8 | 2.25 | 0.000449 | 0.000174 | 0.000449 | 0.185 | 0.0470 | 0.185 |
| ........ | | | | | | | | | | |
| M2 | M4 | 0.45 | 0.9 | 0.0 | 0.000679 | 0.000185 | 0.000589 | 0.126 | 0.0062 | 0.113 |

TABLE D

CCT Polish Program Output

VICT_NET= "|mcode_load_r_rp(19)"
PERP_NET= "|dat|xlat_eax_q(2)"
.........................................
TOTAL NOISE for Vict. net "|mcode_load_r_rp(19)" for
cap. coup.= 0.33076 for ind. coup.= 0.0460821 for both=
0.376828 TOT_COUP_LNTH= 5.5542

Expanding this detail the Polish Output File could be illustrated with:

---

Abbreviations:
PTH#                wire path segment number
PRP#                perp number
V_or_V              refers to victim
P_or_P or PRP_      refers to perp
WDTH                wire width
Vmaxc               capacitive coupling voltage
Vmaxl               inductive coupling voltage
m4 m4 0.45 0.45     4 values: ((metal level of victim) (metal level of perp) (width of victim)
(width of perp)
act_gap             actual gap (spacing) between victim and perp wires
Tr                  transition time

---

Output:
VICT_NET= "lmcode_load_r_rp(19)"
PERP_NET= "Idatlxlat_eax_q(2)" perp1
V_CP_SEC PTH#=3 PRP#=1 WDTH_V=0.9
VICT_RES & CAP: yHL PRP#=1 CP_LOC=3 R=56.8394 C=0.020644
P_CP_SEC PTR#=3 yHL PRP#=1 WDTH_P=0.9
EXTRACT_TABLE: m4 m4 0.45 0.45 act_gap=0.45
PRP_RES=0.0640475 Cup=0.0544986 Cdn=0.0597558
Rdriv=0.01045 Rtotal=0.0672894 Ct=0.195654 Tr@perp_driv=0.1 Tr@coup.sect.=0.113101
Vict.=CASE: RIPPLE Vmaxc=0.0731379 Vmax1=1.80227e-05 Vself1=0.00659157 COUP_LNTH=0.7928
PERP NET="Idatlxlat-alet-save_q(24)" perp2
V_CP_SEC PTH#=9 PRP#=2 WDTH_V=0.9
VICT_RES & CAP: xLH PRP#=2 CP_LOC=9 R=52.47 C=0.10492
VICT_RES & CAP: xLH PRP#=2 CP_LOC=9 R=52.47 C=0.108009
P_CP_SEC PTH#=1 yLH PRP#=2 WDTH_P=0.9
EXTRACT_TABLE: m4 m4 0.45 0.45 act_gap=0.45
PRP_RES=0.0749742 Cup=0.0637962 Cdn=0.0785096
Rdriv=0.01045 Rtotal=0.06292 Ct=0.26675 Tr@perp_driv=0.17 Tr@coup.sect.=0.189506
Vict.=CASE: RIPPLE Vmaxc=0.0349794 Vmaxl=8.36191e-06 Vselfl=0.00128853 COUP_LNTH=0.7191
PERP_NET="Idatlxlat_base_mux(23)" perp 3
..........................................
TOTAL NOISE Vict. cap. coup.=0.330746 for ind. coup.=0.0460821 for both=0.376828 TOT_COUP_LNTH=5.5542

---

(Note the TOTAL NOISE Vic. cap. coupling line ending Table D. provides the Victim net's separate contributions for inductive and capacitive noise voltages.)

TABLE E

Network Model for Input to ASX Simulation

*START NEW VICTIM NET* model description model
cct_asx( ) elements *** set global environmental conditions once per victim
pr_sht=1
pr_adj_v=1
pr_adj_p=1
pxt=55
pvdd=1.8
***
*** VICT "|mcode_load_r_rp(19)"
l1_1v = model m3_9s (v1_1-ref-v2_1)
    (pc11=0.220113 ,pl11=0.000650837 ,pw01=0.45 ,p1=0.083975) ; *10
l2_1v = model m2_9s (v2_1-ref-v3_1)
    (pc11=0.239904 ,pl11=0.000652594 ,pw01=0.45 ,p1=0.165675) ; *5
l3_1v = model m2_9s (v3_1-ref-v4_1)
    (pc11=0.239904 ,pl11=0.000662594 ,pw01=0.45 ,p1=0.5525) ; *4
l4_1v = model ml_9s (v4_1-ref-v5_1)
    (pc11=0.188922 ,pl11=0.000719493 ,pw01=0.45 ,p1=0.11475) ; *11
CVR1_1,v5_1-ref=.05 ; pmax1_1v=(vmax(dabs(vcvr1_1),0,5))
l6_1v = model m3_9s (v3_1-ref-v6_1)
    (pc11=0.220113 ,pl11=0.000650837 ,pw01=0.45 ,p1=0.164625) ; *6
l7_1v = model m4_9s (v6_1-ref-v7_1)
    (pc11=0.220749 ,pl11=0.000635773 ,pw01=0.45 ,p1=1.62435 ; *9
l8_1v = model m3_9s (v7_1-ref-v8_1)
    (pc11=0.220113 ,pl11=0.000650837 ,pw01=0.45 ,p1=0.01755) ; *8
l9_1v = model m4_m4_9s (v8_1-p1_1-ref-v8A_1-p2_1)
    (pc11=0.220749,pc12=0.0783952,pc22=0.220715,
    pl11=0.000635773,pl12=0.000366109,pl22=0.000635889,
    pw01=0.45,pw02=0.45,pl=0.7928) ; *3

TABLE E-continued

Network Model for Input to ASX Simulation l9A__1v = model m4__9s (v8A__1-ref-v9__1)
    (pc11=0.220749 ,pl11=0.000635773 ,pw01=0.45 ,pl=0.17035) ; *3
l10__1v = model m3__9s (v9__1-ref-v10__1)
    (pc11=0.220113 ,pl11=0.000650837 ,pw01=0.45 ,pl=0.0171) ; *2
l11__1v = model m2__9s (v10__1-ref-v11__1)
    (pc11=0.239904 ,pl11=0.000662594 ,pw01=0.45 ,pl=0.01105) ; *1
CVR2__1, v11__1-ref=.05; pmax2__1v=(vmax(dabs(vcvr2__1),0,5))
l13__1v = model m3__9s (v8__1-ref-v12__1)
    (pc11=0.220113 ,pl11=0.000650837 ,pw01=0.45 ,pl=0.0297) ; *7
CVR3__1, v12__1-ref=.05 ; pmax3__1v=(vmax(dabs(vcvr3__1),0,5))
*** terminal conditions for vict net
rdv1__1,vd1__1-v1__1=(pr__adj__v*0.01045)
edv1__1,ref-vd1__1=(SINSQ(5.1,ptrv1__1,10,10.1,20,0,pvdd)) ; ptrv1__1=(5.1+7*atrv1__1) ; atrv1__1=.1
*** PERP__NUM= 1 "|dat|xlat__eax__q(2)"
l2__1p = model m3__9s (p2__1-ref-p3__1)
    (pr__sht=pr__sht, pc11=0.220113 ,pl11=0.000650837,pw01=0.45,pl=0.0486) ; *r3
l3__1p = model m2__9s (p3__1-ref-p4__1)
    (pr__sht=pr__sht, pc11=0.239904 ,pl11=0.000662594,pw01=0.45,pl=0.00195) ; *r3
CPR1__1,p4__1-ref=.05 ; pmax1__1p=(vmax(dabs(vcpr1__1),5,10)-pvdd)
*** terminal conditions for perp1
rdp1__1,pd1__1-p1__1=(pr__adj__p*0.045)
edp1__1,ref-pd1__1=(SINSQ(0.1,ptrp1__1,10,10.1,20,0,pvdd)) ; ptrp1__1=(0.1+7*atrp1__1) ; atrp1__1=0.1
*** VICT "|mcode__load__r__rp(19)"
l1__10v = model m3__9s (v1__10-ref-v2__10)
    (pc11=0.220113 ,pl11=0.000650837 ,pw01=0.45 ,pl=0.083975) ; *10
l2__10v = model m2__9s (v2__10-ref-v3__10)
    (pc11=0.239904 ,pl11=0.000662594 ,pw01=0.45 ,pl=0.165675) ; *5
l3 10v = model m2__9s (v3__10-ref-v4__10)
    (pc11=0.239904 ,pl11=0.000662594 ,pw01=0.45 ,pl=0.5525) ;
l4__10v = model m1__9s (v4__10-ref-v5__10)
    (pc11=0.188922 ,pl11=0.000719493 ,pw01=0.45 ,pl=0.11475) ; *11
CVR1__10, v5__10-ref=.05 ; pmax1__10v=(vmax(dabs(vcvr1__10),0,5))
l6__10v = model m3__9s (v3__10-ref-v6__10)
    (pc11=0.220113 ,pl11=0.000650837 ,pw01=0.45 ,pl=0.164625) ; *6
l7A__10v = model m4__9s (v6__10-ref-v6A__10)
    (pc11=0.220749 ,pl11=0.000635773 ,pw01=0.45 ,pl=0.426175) ; *9
l7__10v = model m4__m4__9s (v6A__10-p5__10-ref-v7__10-p6__10)
    (pc11=0.135257,pc12=0.0370535,pc22=0.147989,
    pl11=0.000637586,pl12=0.000243462,pl22=0.000575234,
    pw01=0.45,pw02=0.9,pl=0.294275) ; *9
l8__10v = model m3__9s (v7__10-ref-v8__10)
    (pc11=0.220113 ,pl11=0.000650837 ,pw01=0.45 ,pl=0.01755) ; *8
l9__10v = model m4__9s (v8__10-ref-v9__10)
    (pc11=0.220749 ,pl11=0.000635773 ,pw01=0.45 ,pl=0.96315) ; *3
l10__10v = model m3__9s (v9__10-ref-v10__10)
    (pc11=0.220113 ,pl11=0.000650837 ,pw01=0.45 ,pl=0.0171) ; *2
l11__10v = model m2__9s (v10__10-ref-v11__10)
    (pc11=0.239904 ,pl11=0.000662594 ,pw01=0.45 ,pl=0.01105) ; *1
CVR2__10,v11__10-ref=.05 ; pmax2__10v=(vmax(dabs(vcvr2__10),0,5))
l13__10v = model m3__9s (v8__10-ref-v12__10)
    (pc11=0.220113 ,pl11=0.000650837 ,pw01= 0.45 ,pl=0.0297) ; *7
CVR3__10, v12__10-ref=.05 ; pmax3__10v=(vmax(dabs(vcvr3__10),0,5))
*** terminal conditions for vict net
rdv1__10,vd1__10-v1__10=(pr__adj__v*0.01045)
edv1__10,ref-vd1__10=(SINSQ(5.1,ptrv1__10,10,10.1,20,0,pvdd))
ptrv1__10=(.1+.7*atrv1__10) ; atrv1__10=.1
*** PERP__NUM= 10 "|log__addr__c1__q(18)"
l1__10p = model m3__9s (p1__10-ref-p2__10)
    (pr__sht=pr__sht, pc11=0.172819 ,pl11=0.000584434,pw01=0.9,pl=0.029475) ;
*r3
l2__10p = model m4__9s (p2__10-ref-p3__10)
    (pr__sht=pr__sht, pc11=0.173944 ,pl11=0.000568727,pw01=0.9,pl=2.86708) ;
*r3
l3__10p = model m3__9s (p3__10-ref-p4__10)
    (pr__sht=pr__sht, pc11=0.172819 ,pl11=0.000584434,pw01=0.9,pl=1.41882) ;
*r3
l4__10p = model m3__9s (p4__10-ref-p5__10)
    (pr__sht=pr__sht, pc11=0.172819 ,pl11=0.000584434,pw01=0.9,pl=0.05805) ;
*r3
l6__10p = model m3__9s (p6__10-ref-p7__10)
    (pr__sht=pr__sht, pc11=0.172819 ,pl11=0.000584434,pw01=0.9,pl=0.008775) ;
*r3
CPR1__10,p7__10-ref=.05 ; pmax1__10p=(vmax(dabs(vcpr1__10),5,10)-pvdd)
l8__10p = model m4__9s (p2__10-ref-p8__10)
    (pr__sht=pr__sht, pc11=0.173944 ,pl11=0.000568727,pw01=0.9,pl=0.089075) ;
*r3
l9__10p = model m3__9s (p8__10-ref-p9__10)

TABLE E-continued

Network Model for Input to ASX Simulation

```
    (pr__sht=pr__sht, pc11=0.172819 ,pl11=0.000584434,pw01=0.9,pl=1.43665) ;
*r3
l10__10p = model m2__9s (p9__10-ref-p10__10)
    (pr__sht=pr__sht, pc11=0.181526 ,pl11=0.00060343,pw01=0.9,pl=0.04655) ;
*r3
CPR2__10,p10__10-ref=.05 ; pmax2__10p=(vmax(dabs(vcpr2__10),5,10)-pvdd)
l12__10p = model m2__9s (p4__10-ref-p11__10)
    (pr__sht=pr__sht, pc11=0.181526 ,pl11=0.00060343,pw01=0.9,p1=0.0993) ; *r3
CPR3__10,p11__10-ref=.05 ; pmax3__10p=(vmax(dabs(vcpr3__10),5,10)-pvdd)
*** terminal conditions for perp10
rdp1__10,pd1__10-p1__10=(pr__adj__p*0.01155)
edp1__10,ref-pd1__10=(SINSQ(0.1,ptrp1__10,10,10.1,20,0,pvdd)) ;
ptrp1__10=(.1+.7*atrp1__10) ; atrp1__10=0.1
    functions
    features
    ground = (ref)
    execution controls
    analyze cct__asx(transient )
    run controls
    graphics
    RELATIVEERROR=0.02
    ABSOLUTEERROR=0.002
    start time =0.0
    stop time = 5.0
    *suppress print
    outputs
    print(final values) pindc, pindu, pr__sht
    print(final values) pmax1__1v, pmax1__2v, pmax1__3v, pmax1__4v, pmax1__5v, pmax1__6v,
pmax1__7v, pmax1__8v, pmax1__9v, pmax1__10v
    print(final values) pmax2__1v, pmax2__2v, pmax2__3v, pmax2__4v, pmax2__5v, pmax2__6v,
pmax2__7v, pmax2__8v, pmax2__9v, pmax2__10v
    print(final values) pmax3__1v, pmax3__2v, pmax3__3v, pmax3__4v, pmax3__5v, pmax3__6v,
pmax3__7v, pmax3__8v, pmax3__9v, pmax3__10v
    print(final values) nv5__1, nv5__2, nv5__3, nv5__4, nv5__5, nv5__6, nv5__7, nv5__8,
nv5__9, nv5__10
    print(final values) nv11__1, nv11__2, nv11__3, nv11__4, nv11__5, nv11__6, nv11__7,
nv11__8, nv11__9, nv11__10
    print(final values) nv12__1, nv12__2, nv12__3, nv12__4, nv12__5, nv12__6, nv12__7,
nv12__8, nv12__9, nv12__10
    reruns
    pindc= (1e-4,1 ,1e-4,1e-4)
    pindu= (1   ,1e-4,1e-4,1e-4)
    pr__sht=(1  ,1   ,1   ,1e-4)
    end
```

TABLE F

ASX Output (NOT for sample net)

```
AS/X 01.02.0022 10/25/97
RISC S/6000 AIX
                                        DECEMBER 18, 1997
                                                 15:51 PM
                                             INPUT PHASE
************************************
     1 C *START NEW VICTIM NET5*
     PART 1 OF THE INPUT DATA:
     2    model description
     3    model cct__asx( )
     4    elements
     5 C *** set global environmental conditions once
per victim
     6    pindu=1
     7    pindc=1
     8    pr__adj__v=1
     9    pr__adj__p=1
    10    pr__sht=1
    11    pxt=55
    12    pvdd=1.8
    13 C ***
    14 C *** VICT "|fsa__q(4)"
    15    l1__1v = model m3__9s (v1__1-ref-v2__1)
    16        (pc11=0.220113 ,pl11=0.000650837
```

TABLE F-continued

ASX Output (NOT for sample net)

```
            ,pw01=0.45 ,pl=0.01965) ; *3
    17    12A__1v = model mq__9s (v2__1-ref-v2A__1)
..............................................
INPUT SCANNING ENDS,           .580 SECONDS
CODE CLASSIFICATION ENDS,      .150 SECONDS
TOPOLOGICAL MATRIX DONE,       .040 SECONDS
SOLUTION MATRIX DONE,          .210 SECONDS
MATRIX OPTIMIZATION DONE,    1.490 SECONDS
SOLUTION DATA SAVED,           .650 SECONDS
**NO ERRORS DETECTED
TOTAL INPUT STEP TIME,       3.130 SECONDS
AS/X 01.02.0022 10/25/97
RISC S/6000    AIX
                                        DECEMBER 18, 1997
                                                 15:52 PM
                                         EXECUTION PHASE
************************************
*I* ASX0269I Fill code loaded at 39173fa0.
     GO DATA :
        1 GO 1AS/X 01.02.0022 10/25/97
RISC S/6000    AIX
```

(Table G results)
DECEMBER 18, 1997
15:52 PM
RESULTS OF RUN

1
*******************************

|  | Minimum | Minimum Time | Maximum | Maximum Time |
|---|---|---|---|---|
| PINDC | 1.0000 | 0.00000E+00 | 1.0000 | 0.00000E+00 |
| PINDU | 1.0000 | 0.00000E+00 | 1.0000 | 0.00000E+00 |
| PR_SHT | 1.0000 | 0.00000E+00 | 1.0000 | 0.00000E+00 |
| PMAXI_1V | 0.00000E+00 | 0.00000E+00 | .16374 | .10364 |
| PMAXI_2V | 0.00000E+00 | 0.00000E+00 | 7.42307E-02 | .19347 |
| PMAXI_3V | 0.00000E+00 | 0.00000E+00 | 1.52738E-02 | .19838 |

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A program method for calculating crosstalk voltage and modeling for a planned chip design, comprising the steps of running in a first process a program for routing and crosstalk routines for routing exact topologies/paths of the victim and perpetrator nets of the planned chip design and for creating crosstalk rules for the planned chip design and in which program if said crosstalk rules are loaded before wire routing has been completed, the routing program will attempt to obey said crosstalk rules and avoid crosstalk and cause a crosstalk report to be generated;

loading crosstalk rules into said program for routing and crosstalk routines after routing is completed for network analysis, whereby action of said program causes a crosstalk report to be generated at that time; and in a second process calculating a noise voltage of the planned chip design based on said exact topologies/paths of the victim and perpetrator nets of the planned chip design by path tracing and outputting a polish program file which contains the calculated noise voltage and a complete tabulation of key physical and electrical parameters the victim and perpetrator nets of the planned design, and then in a third process, modeling using a network analysis topology simulation modeling program for selected nets on selected nets of the planned chip design which exceed allowed noise limitations and obtaining the planned chip design net's network topology as an output while using said polish program file as an input to the network analysis topology circuit simulation modeling program and outputting the nodal voltages vs. time at each receiver location on a victim net as well as key nodes on any perpetrator nets of said planned chip design.

2. A program method according to claim 1 in which said first process uses a routing analysis/avoidance program; said second process employs a polish (refining) program for detailed noise voltage prediction for creating said polish program file, and noise analysis is effected with the use of said network analysis simulation program which provides an ASX simulation on selected nets.

3. A program method according to claim 1 in which the first process uses a noise voltage calculation equation, where noise voltage equals a "weight" multiplied by the value of the parallel length of two adjacent wires, and the "weight" depends on the spacing between the two wires and the key electrical and physical properties but not the topology of the victim and perpetrator nets.

4. A program method according to claim 1 in which the first process uses crosstalk rules generation programs which generate weight values and divides the planned chip design perpetrator and victim nets into classes automatically after reading a timing database and net length and wherein program generated crosstalk rules which where created provide weights which vary according to many class combinations between victim and perpetrator nets, and wherein said generated crosstalk rules are loaded into a planned chip design router tool after routing and a crosstalk report is then generated.

5. A program method according to claim 4 in which thereafter the process may a. delete all the previously routed wires and route again with the crosstalk rules loaded so now the program for routing will try to obey the rules thereby reducing crosstalk; or b. perform more accurate noise voltage calculations using a polishing program which uses the crosstalk report as one of its data file inputs.

6. A program method according to claim 5 in which the second process causes said polish program to read the crosstalk report and other files to produce said program file which lists a total noise voltage calculated for each victim net, said polish program having steps including:

(A) based on driver pin name, creating arrays for inst. name and pin name for each victim and perpetrator net;

(B) creating arrays for component name for each net, pin #

(C) determining chip level locations for macro output pins for each net;

(D) tracing paths for each net to create a string of path segments for each receiver;

(E1) locating each coupling section in victim path sequence; and (E2) looping on all path segments to find match with perpetrator coupling section (perp. coup. sect);

(F) calculating extraction parameters;

(G) calling noise voltage functions; and (H) providing function definitions for damped, perfect, and ripple cases.

7. A program method according to claim 5 in which the second process causes said polish program to read the crosstalk report and other files to produce said program file which lists a total noise voltage calculated for each victim net, said polish program having steps including:

tracing paths for each net to create a string of path segments for both the victim and perpetrator nets.

8. A program method according to claim 7 in which a net is a connection of pins, and its routing contains wire segments called paths and the polish program reads path statements and traces their sequences from a driver pin to one or more receiver pins, wherein a path statement can have multiple wire segments wherein a wire segment is defined by a pair of xy values; and each path statement includes a field which indicates either the x or y direction for the wire segment (by either a low to high or high to low designation of coordinate values) which is added to the path statement by the trace routine, and wherein said noise voltage is a function of the signal direction, and is greater when the signal directions are opposite for the victim and perpetrator nets.

9. A program method according to claim 7 in which a net is a connection of pins, and its routing contains wire segments called paths and the polish program reads path statements and traces their path sequence from a driver pin to one or more receiver pins, wherein the path tracing algorithm outputs are strings indicating the path from the driver to each receiver, said path sequence taking into account multiple branches on the net, and the polish program does its noise calculations using said path statement sequences to determine electrical parameters, including resistance from a driver pin to a coupling section for a victim net and the total capacitance downstream, including branches, from the coupling section of a perpetrator net, and wherein downstream capacitance is used to calculate transition time degradation along the perpetrator net from its driver to the coupling section for a victim net.

10. A program method according to claim 9 in which sections of the polish program link the path sequences from the path tracing with the x,y data from the crosstalk report and thus locate a coupling section path statement number for both the victim and perpetrator nets.

11. A program method according to claim 9 in which the second process estimates the noise levels (in mV) on a victim net due to transition on a perpetrator net with only one perpetrator and one victim net used and the estimates are based on a lumped elements model of coupled transmission lines.

12. A program method according to claim 11 in which the parameters for the lumped elements model are:

a. Perp transition time (Tr ns);

b. Mutual capacitance between the two nets (C12 mF);

c. Self-capacitance of the victim net (Cg mF);

d. Self-inductance of the victim net (Lg mH); and e. Wire resistance of the victim net + output resistance of the victim driver.

* * * * *

UNITED STATES PATENT AND TRADEMARK OFFICE
CERTIFICATE OF CORRECTION

PATENT NO. : 6,028,989
DATED : February 22, 2000
INVENTOR(S) : Dansky et al.

It is certified that error appears in the above-identified patent and that said Letters Patent is hereby corrected as shown below:

TABLE B, insert before first row in Column 9, --
 -- No Layer Crosstalk Rules Defined --
Net Crosstalk Rules ================================ --.

TABLE E, row 29, in Column 13, sould be --(pc11=0.239904 ,pl11=0.000662594 , pw01=0.45 ,pl=0.5525) ; *4--.

TABLE E, row 38, in Column 13, should be --(pc11=0.135257,pc12=0.0370535,pc22=0.147909,--.

TABLE G, row 4, in Column 17, delete ".10364" and insert --.18364--.

Signed and Sealed this

Sixteenth Day of January, 2001

Q. TODD DICKINSON

*Attest:*

*Attesting Officer*  *Commissioner of Patents and Trademarks*